United States Patent
Lu (10) Patent No.: US 10,263,138 B2
(45) Date of Patent: Apr. 16, 2019

(54) MICRO LIGHT-EMITTING-DIODE DISPLAY PANEL AND MANUFACTURING METHOD THEREOF

(71) Applicant: Shenzhen China Star Optoelectronics Technology Co., Ltd., Shenzhen (CN)

(72) Inventor: Macai Lu, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/548,104

(22) PCT Filed: Jun. 20, 2017

(86) PCT No.: PCT/CN2017/089253
§ 371 (c)(1),
(2) Date: Aug. 2, 2017

(87) PCT Pub. No.: WO2018/214200
PCT Pub. Date: Nov. 29, 2018

(65) Prior Publication Data
US 2018/0342691 A1  Nov. 29, 2018

(30) Foreign Application Priority Data
May 23, 2017 (CN) .......................... 201710370731.9

(51) Int. Cl.
*H01L 33/00* (2010.01)
*H01L 33/10* (2010.01)
*H01L 25/16* (2006.01)
*H01L 33/30* (2010.01)
(Continued)

(52) U.S. Cl.
CPC .......... *H01L 33/005* (2013.01); *H01L 25/167* (2013.01); *H01L 27/15* (2013.01);
(Continued)

(58) Field of Classification Search
CPC ..... H01L 27/15; H01L 27/153; H01L 33/005; H01L 33/60; H01L 33/10; H01L 33/20;
(Continued)

(56) References Cited

U.S. PATENT DOCUMENTS 9,761,754 B2 * 9/2017 Bower .................. H01L 33/007
2004/0115849 A1 * 6/2004 Iwafuchi ............. H01L 21/2007
438/25
(Continued)

FOREIGN PATENT DOCUMENTS

CN   104838508 A   8/2015
CN   104952899 A   9/2015
(Continued)

*Primary Examiner* — Scott B Geyer
(74) *Attorney, Agent, or Firm* — Leong C. Lei (57) ABSTRACT

The present invention provides a micro light-emitting-diode display panel and a manufacturing method thereof. The micro light-emitting-diode display panel which presses and fixes the micro light-emitting-diodes into a resin adhesive layer by filling the resin adhesive layer in the pixel groove. Meanwhile, the electrode at the bottom of the micro light-emitting-diode is guided to the top of the micro light-emitting-diode by the connection electrode, making the two electrodes of the micro light-emitting-diode are at the top, to facilitate the connection between the electrodes of the micro light-emitting-diode and the electrode points, which can reduce the difficulty of the electrode bonding of the micro light-emitting-diode, and improve the reliability of the electrode bonding of the micro light-emitting-diode.

12 Claims, 9 Drawing Sheets

(51) Int. Cl.
    *H01L 33/60*     (2010.01)
    *H01L 33/20*     (2010.01)
    *H01L 27/15*     (2006.01)
    *H01L 33/48*     (2010.01)
    *H01L 33/52*     (2010.01)

(52) U.S. Cl.
    CPC .............. *H01L 33/10* (2013.01); *H01L 33/20* (2013.01); *H01L 33/30* (2013.01); *H01L 33/486* (2013.01); *H01L 33/52* (2013.01); *H01L 33/60* (2013.01)

(58) Field of Classification Search
    CPC ... H01L 33/486; H01L 33/52; H01L 21/7806; H01L 21/7813; H01L 21/786; H01L 24/93–24/98; H01L 2021/775; F21Y 2115/10
See application file for complete search history.

(56) References Cited

U.S. PATENT DOCUMENTS

| | | | |
|---|---|---|---|
| 2005/0176190 A1* | 8/2005 | Tomoda | H01L 21/268 438/166 |
| 2014/0061687 A1* | 3/2014 | Hu | H01L 24/75 257/88 |
| 2014/0159066 A1* | 6/2014 | Hu | H01L 25/0753 257/88 |
| 2014/0267683 A1 | 9/2014 | Bibl et al. | |
| 2017/0278733 A1* | 9/2017 | Chang | H01L 21/67144 |
| 2018/0069149 A1* | 3/2018 | Zou | H01L 21/68 |

FOREIGN PATENT DOCUMENTS

| | | |
|---|---|---|
| CN | 105324858 A | 2/2016 |
| CN | 106058010 A | 10/2016 |

* cited by examiner

MICRO LIGHT-EMITTING-DIODE DISPLAY PANEL AND MANUFACTURING METHOD THEREOF

BACKGROUND OF THE INVENTION

Field of Invention

The present invention relates to the field of liquid crystal display, and more particularly to a micro light-emitting-diode display panel and a manufacturing method thereof.

Description of Prior Art

Because of the advantages of high quality, power saving, thin body and wide applications, the flat panel display devices has become a mainstream in the display devices and been widely used in various consumer electronic devices, such as mobile phones, personal digital assistants, digital cameras, laptops, and desktop computers.

A micro LED display is a display that achieves image display by using a high density and small size LED arrays integrated on a substrate as display pixels, the same as the large-size outdoor LED display, each pixel can be addressed, be individually driven to light, can be seen as a shrink-down version of the outdoor LED display, to reduce the pixel distance from millimeter to micron. The Micro LED display and the organic light-emitting-diode (OLED) display are belong to self-luminous displays, however, with comparing with OLED display, the Micro LED display has better material stability, longer life, no image mark, etc., which is considered the biggest competitor of the OLED display.

In the manufacturing process of the micro LED display panel, the micro light-emitting-diodes must grow on an original substrate (such as sapphire-type substrate) by the molecular beam epitaxy method, for making the display panel, the micro light-emitting-diode devices should be transferred from the original substrate to a receiving substrate for forming the display panel in a display arrangement. Specifically, the micro light-emitting-diode is firstly formed on the original substrate, then, the micro light-emitting-diodes are lifted from the original substrate by a laser lift-off (LLO) technology, the micro light-emitting-diodes are adhered from the original substrate to preset positions of the receiving substrate, by using a transfer head which is made of a material such as polydimethylsiloxane (PDMS).

Presently, after the micro light-emitting-diodes are transferred onto the receiving substrate, it is necessary to bond with the pre-installed Bonding material on the receiving substrate, which involves the solid-liquid-solid transformation of the bonding material. The bonding process is complex, difficult, and less reliable.

SUMMARY OF THE INVENTION

An object of the present invention is to provide a micro light-emitting-diode display panel, which can reduce the bonding difficulty of the light-emitting-diodes and improve the reliability of the electrode bonding of the light-emitting-diodes.

An object of the present invention is to further provide a manufacturing for a micro light-emitting-diode display panel, which can reduce the bonding difficulty of the light-emitting-diodes and improve the reliability of the electrode bonding of the light-emitting-diodes.

In order to achieve the objective, the present invention provides a micro light-emitting-diode display panel, which comprises a base substrate, a pixel definition layer disposed on the base substrate, a pixel definition layer disposed on the base substrate, a pixel groove formed in the pixel definition layer, a resin adhesive layer disposed in the pixel groove, a micro light-emitting-diode embedded in the resin adhesive layer, and a first electrode point and a second electrode point on the pixel definition layer respectively located on both sides of the pixel groove.

The micro light-emitting-diode comprises: a connection electrode, an LED semi-conductor layer disposing above the connection electrode and contacting with the connection electrode, a first electrode disposing on the LED semi-conductor layer and contacting with the LED semi-conductor layer, a second electrode disposing on the LED semi-conductor layer and contacting with the connection electrode, and an insulation-protective layer surrounding the LED semi-conductor layer.

A portion of the connection electrode contacting with the second electrode and an upper surface of the LED semi-conductor layer are both exposed to an outside of the resin adhesive layer. The first electrode and the second electrode are respectively connected to the first electrode point and second electrode point.

The micro light-emitting-diode display panel further comprises a TFT layer disposed between the base substrate and the pixel definition layer.

The TFT layer comprises: an active layer disposed on the base substrate, a gate insulating layer covering the active layer and the base substrate, a gate electrode disposed on the gate insulating layer above the active layer, an intermediate insulating layer covering the gate electrode and the gate insulating layer, and a source electrode and a drain electrode disposing on the intermediate insulating layer and contacting with two ends of the active layer. The first electrode point further is contacted with the source electrode.

The resin adhesive layer is made of PMMA.

The present invention further provides a method for manufacturing a micro light-emitting-diode display panel, which comprises:

Step 1, an original substrate is provided. An LED semi-conductor layer disposed on the original substrate, a first insulating layer covering the LED semi-conductor layer and the original substrate, and a connection electrode disposed on the first insulating layer and contacted with the LED semi-conductor layer and the original substrate are orderly formed.

Step 2, a transporting substrate is provided. A surface of the transporting substrate is bonded to the connection electrode. The original substrate is peeled off, to transfer all of the LED semi-conductor layer, the first insulating layer, and the connection electrode to the transporting substrate and to expose the LED semi-conductor layer, the first insulating layer, and a portion of the connection electrode contacted with the original substrate.

Step 3, a second insulating layer is formed on the exposed LED semi-conductor layer, the first insulating layer, and the connection electrode. A first electrode via and a second electrode via are formed on the second insulating layer, respectively exposing a portion of the LED semi-conductor layer and a portion of the connection electrode by the first electrode via and the second electrode via, to obtain a micro light-emitting-diode semi-finished product.

Step 4, a transfer head and a receiving substrate are provided. The receiving substrate comprises: a base substrate, a pixel definition layer disposed on the base substrate, a pixel groove formed in the pixel definition layer, a resin adhesive layer disposed in the pixel groove, and a first electrode point and a second electrode point on the pixel definition layer respectively located on both sides of the pixel groove.

Step 5, the micro light-emitting-diode semi-finished product on the transporting substrate are transferred onto the pixel groove of the receiving substrate by the transfer head, to press and fix the micro light-emitting-diode semi-finished product in the resin adhesive layer. The portion of the connection electrode exposed by the second electrode via and an upper surface of the LED semi-conductor layer are both exposed to outside of the resin adhesive layer.

Step 6, a first electrode and a second electrode are formed on the micro light-emitting-diode semi-finished product, to form the micro light-emitting-diode. The first electrode is contacted with the LED semi-conductor layer and the first electrode point. The second electrode is contacted with the connection electrode and the second electrode point.

The step S1 specifically comprises:

Step 11, an original substrate is provided. An LED semi-conductor thin film is formed on the original substrate. A patterned first photoresist layer is formed on the LED semi-conductor thin film.

Step 12, the LED semi-conductor thin film is etched with the first photoresist layer as a shielding, to form a LED semi-conductor layers.

Step 13, a first insulating layer is covered on the LED semi-conductor layer and the original substrate. A patterned second photoresist layer is formed on the first insulating layer.

Step 14, the first insulating layer is etched with the second photoresist layer as a shielding, to form a first via and a second via, penetrating through the first insulating layer. The first via and the second via respectively reveals a portion of the LED semi-conductor layer and a portion of the original substrate.

Step 15, a first metal thin film is formed on the first insulating layer, the LED semi-conductor layer, and the original substrate. A patterned third photoresist layer is formed on the first metal thin film.

Step 16, the first metal thin film is etched with the third photoresist layer as a shielding, to form a connection electrode. The connection electrode respectively is contacted with the LED semi-conductor layer and the original substrate through the first via and the second via.

The transporting substrate in the step 2 is a hard substrate having an adhesive layer on its surface. In the step 2, the original substrate is peeled off by a laser lift-off process.

The step 3 specifically comprises:

Step 31, a second insulating layer is formed on the LED semi-conductor layer, the first insulating layer, and the connection electrode. A patterned fourth photoresist layer is formed on the second insulating layer.

Step 32, the second insulating layer is etched with the fourth photoresist layer as a shielding, to form a first electrode via and a second electrode via, penetrating through the second insulating layer. The first electrode via and the second electrode via respectively reveals a portion of the LED semi-conductor layer and a portion of the connection electrode The receiving substrate provided in the step S4 further comprises: a TFT layer disposed between the base substrate and the pixel definition layer.

The TFT layer comprises: an active layer disposed on the base substrate, a gate insulating layer covering the active layer and the base substrate, a gate electrode disposed on the gate insulating layer above the active layer, an intermediate insulating layer covering the gate electrode and the gate insulating layer, and a source electrode and a drain electrode disposing on the intermediate insulating layer and contacting with two ends of the active layer. The first electrode point further is contacted with the source electrode.

The step 6 specifically comprises:

Step 61, a conductive thin film is formed on the micro light-emitting-diode semi-finished product, the pixel definition layer, the first electrode point, the second electrode point, and the resin adhesive layer.

Step 62, a patterned fifth photoresist layer is formed on the conductive thin film.

Step 63, the conductive thin film is etched with the fifth photoresist layer as a shielding, to form a first electrode and a second electrode.

The resin adhesive layer is made of PMMA.

The present invention further provides a method for manufacturing a micro light-emitting-diode display panel, which comprises:

Step 1, an original substrate is provided. An LED semi-conductor layer disposed on the original substrate, a first insulating layer covering the LED semi-conductor layer and the original substrate, and a connection electrode disposed on the first insulating layer and contacted with the LED semi-conductor layer and the original substrate are orderly formed.

Step 2, a transporting substrate is provided. A surface of the transporting substrate is bonded to the connection electrode. The original substrate is peeled off, to transfer all of the LED semi-conductor layer, the first insulating layer, and the connection electrode to the transporting substrate and to expose the LED semi-conductor layer, the first insulating layer, and a portion of the connection electrode contacted with the original substrate.

Step 3, a second insulating layer is formed on the exposed LED semi-conductor layer, the first insulating layer, and the connection electrode. A first electrode via and a second electrode via are formed on the second insulating layer, respectively exposing a portion of the LED semi-conductor layer and a portion of the connection electrode by the first electrode via and the second electrode via, to obtain a micro light-emitting-diode semi-finished product.

Step 4, a transfer head and a receiving substrate are provided. The receiving substrate comprises: a base substrate, a pixel definition layer disposed on the base substrate, a pixel groove formed in the pixel definition layer, a resin adhesive layer disposed in the pixel groove, and a first electrode point and a second electrode point on the pixel definition layer respectively located on both sides of the pixel groove.

Step 5, the micro light-emitting-diode semi-finished product on the transporting substrate are transferred onto the pixel groove of the receiving substrate by the transfer head, to press and fix the micro light-emitting-diode semi-finished product in the resin adhesive layer. The portion of the connection electrode exposed by the second electrode via and an upper surface of the LED semi-conductor layer are both exposed to outside of the resin adhesive layer.

Step 6, a first electrode and a second electrode are formed on the micro light-emitting-diode semi-finished product, to form the micro light-emitting-diode. The first electrode is contacted with the LED semi-conductor layer and the first electrode point. The second electrode is contacted with the connection electrode and the second electrode point.

Wherein, the step S1 specifically comprises:

Step 11, an original substrate is provided. An LED semi-conductor thin film is formed on the original substrate. A patterned first photoresist layer is formed on the LED semi-conductor thin film.

Step 12, the LED semi-conductor thin film is etched with the first photoresist layer as a shielding, to form a LED semi-conductor layers.

Step 13, a first insulating layer is covered on the LED semi-conductor layer and the original substrate. A patterned second photoresist layer is formed on the first insulating layer.

Step 14, the first insulating layer is etched with the second photoresist layer as a shielding, to form a first via and a second via, penetrating through the first insulating layer. The first via and the second via respectively reveals a portion of the LED semi-conductor layer and a portion of the original substrate.

Step 15, a first metal thin film is formed on the first insulating layer, the LED semi-conductor layer, and the original substrate. A patterned third photoresist layer is formed on the first metal thin film.

Step 16, the first metal thin film is etched with the third photoresist layer as a shielding, to form a connection electrode. The connection electrode respectively is contacted with the LED semi-conductor layer and the original substrate through the first via and the second via.

Wherein, the transporting substrate in the step 2 is a hard substrate having an adhesive layer on its surface. In the step 2, the original substrate is peeled off by a laser lift-off process.

The beneficial effects of the present invention is: the present invention provides a micro light-emitting-diode display panel which presses and fixes the micro light-emitting-diodes into a resin adhesive layer by filling the resin adhesive layer in the pixel groove. Meanwhile, the electrode at the bottom of the micro light-emitting-diode is guided to the top of the micro light-emitting-diode by the connection electrode, making the two electrodes of the micro light-emitting-diode are at the top, to facilitate the connection between the electrodes of the micro light-emitting-diode and the electrode points, which can reduce the difficulty of the electrode bonding of the micro light-emitting-diode, and improve the reliability of the electrode bonding of the micro light-emitting-diode. The invention also provides a method for manufacturing a micro light-emitting-diode display panel, which can reduce the difficulty of the electrode bonding of the micro light-emitting-diode, and improve the reliability of the electrode bonding of the micro light-emitting-diode.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

The technical proposals and the effects of the present invention will be described in further detail with reference to the below preferred embodiments of the present invention and their accompanying drawings.

Figure 16:
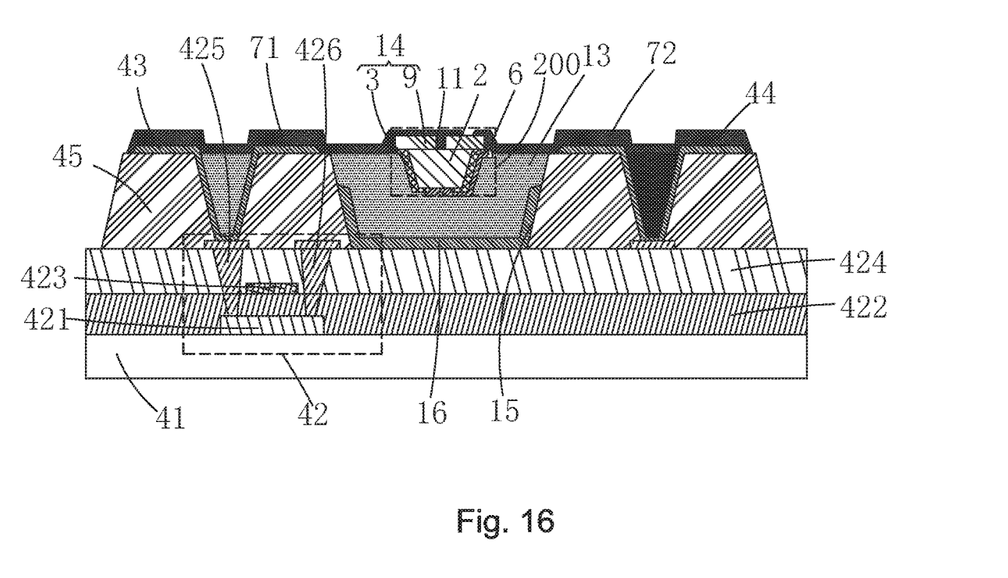
FIG. 16 is illustrative diagram of the step S63 of a method for manufacturing a micro light-emitting-diode display panel according to the present invention and also a structural illustrative diagram of the micro light-emitting-diode display panel according to the present invention.

Please refer to FIG. 16, the present invention provides a micro light-emitting-diode display panel, which comprises a base substrate 41, a pixel definition layer 45 disposed on the base substrate 41, a pixel groove 15 formed in the pixel definition layer 45, a resin adhesive layer 13 disposed in the pixel groove 15, a micro light-emitting-diode 200 embedded in the resin adhesive layer 13, and a first electrode point 43 and a second electrode point 44 on the pixel definition layer 45 respectively located on both sides of the pixel groove 15.

The micro light-emitting-diode 200 comprises: a connection electrode 6, an LED semi-conductor layer 2 disposing above the connection electrode 6 and contacting with the connection electrode 6, a first electrode 71 disposing on the LED semi-conductor layer 2 and contacting with the LED semi-conductor layer 2, a second electrode 72 disposing on the LED semi-conductor layer 2 and contacting with the connection electrode 6, and an insulation-protective layer 14 surrounding the LED semi-conductor layer 2.

A portion of the connection electrode 6 contacting with the second electrode 72 and an upper surface of the LED semi-conductor layer 2 are both exposed to an outside of the resin adhesive layer 14. The first electrode 71 and the second electrode 72 are respectively connected to the first electrode point 43 and second electrode point 44.

Specifically, the micro light-emitting-diode display panel further comprises a TFT layer 41 disposed between the base substrate 41 and the pixel definition layer 45. The TFT layer 42 comprises an active layer 421 disposed on the base substrate 41, a gate insulating layer 422 covering the active layer 421 and the base substrate 41, a gate electrode 423 disposed on the gate insulating layer 422 above the active layer 421, an intermediate insulating layer 424 covering the gate electrode 423 and the gate insulating layer 422, and a source electrode 425 and a drain electrode 426 disposing on the intermediate insulating layer 424 and contacting with two ends of the active layer 421.

The first electrode point 43 further is contacted with the source electrode 425. Specifically, the first electrode contact 43 is in contact with the source electrode 425 through a via extending through the pixel defining layer 45.

Specifically, the micro light-emitting-diode display panel further comprises a reflective metal layer 16 located at the bottom of the pixel groove 15.

Specifically, the LED semi-conductor layer 2 comprises an N+ layer, a P+ layer, and a multi-quantum well layer in contact with the N+ layer and the P+ layer. The material of the connection electrode 6 may be selected from at least one of nickel (Ni), molybdenum (Mo), aluminum (Al), gold (Au), platinum (Pt), and titanium (Ti). The first electrode 71 and the second electrode 72 are transparent electrodes, which are made from indium tin oxide (ITO), indium zinc oxide (IZO), or a mixture of polyethylene dioxythiophene and polystyrene sulfonic acid (PEDOT: PSS). The insulation-protective layer 14 is made from silicon oxide (SiOx), silicon nitride (SiNx), or alumina ($Al_2O_3$).

It is to be noted that the material of the resin adhesive layer 13 is a material having a large adhesive viscosity and can be cured by heat or ultraviolet (UV) light. Preferably, the resin adhesive layer 13 is made of poly Methyl methacrylate (PMMA). When the micro light-emitting-diode 200 is transferred, the resin adhesive layer 13 fixes the micro light-emitting-diode 200 to prevent the positional deviation of the micro light-emitting-diode 200. Meanwhile, the electrode of the bottom of the micro light-emitting-diode 200 to the top of the micro light-emitting-diode 200 is guided by the connection electrode 6, so that the two electrodes of the micro light-emitting-diode 200 are both at the top, not only the connection between the electrodes of the micro light-emitting-diode 200 and the electrode points can be facilitated, but also the difficulty of the electrode bonding of the micro light-emitting-diode 200 can be reduced and the reliability of the electrode bonding of the micro light-emitting-diode 200 can be improved.

Figure 18:
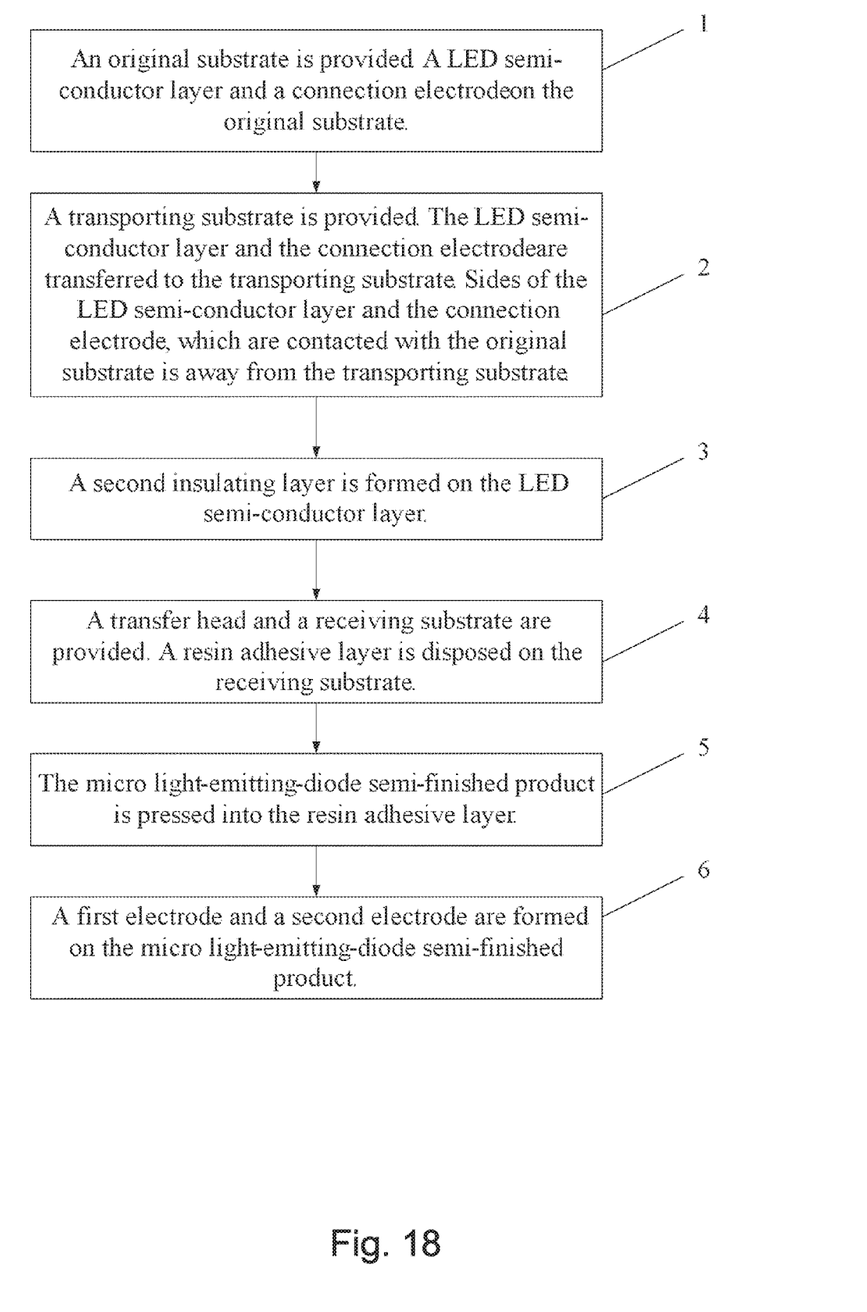
FIG. 18 is a flow diagram of a method for manufacturing a micro light-emitting-diode display panel according to the present invention.

Please refer to FIG. 18, the present invention further provides a method for manufacturing a micro light-emitting-diode display panel, which comprises:

Step 1; please refer to FIGS. 1-8, an original substrate 1 is provided. An LED semi-conductor layer 2 disposed on the original substrate 1, a first insulating layer 3 covering the LED semi-conductor layer 2 and the original substrate 1, and a connection electrode 6 disposed on the first insulating layer 3 and contacted with the LED semi-conductor layer 2 and the original substrate 1 are orderly formed.

Figure 1:
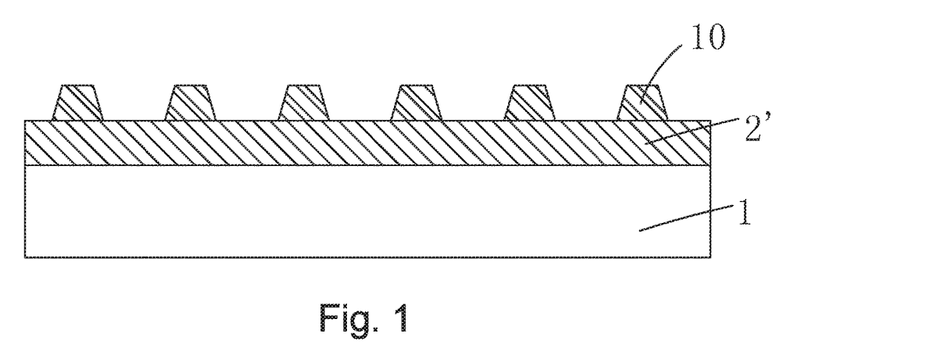
FIGS. 1-8 are illustrative diagrams of the step S1 of a method for manufacturing a micro light-emitting-diode display panel according to the present invention.

Specifically, the step S1 comprises:

Step 11, please refer to FIG. 1, an original substrate 1 is provided. An LED semi-conductor thin film 2' is formed on the original substrate 1. A patterned first photoresist layer 10 is formed on the LED semi-conductor thin film 2'.

Figure 2:
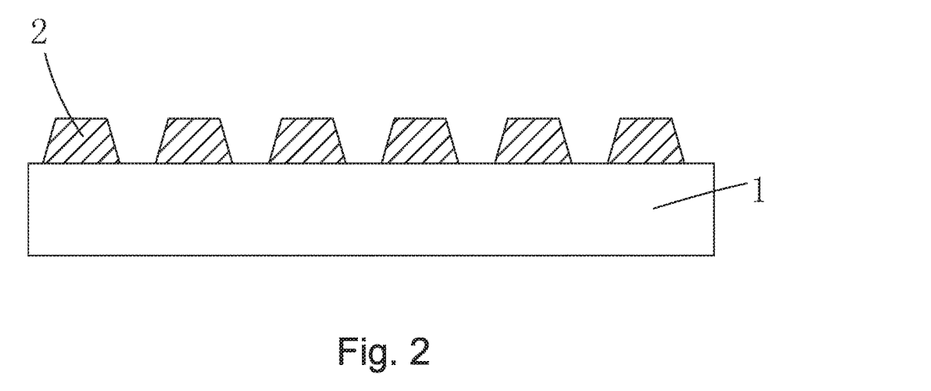

Step 12; please refer to FIG. 2, the LED semi-conductor thin film 2' is etched with the first photoresist layer 10 as a shielding, to form a LED semi-conductor layer 2.

Figure 3:
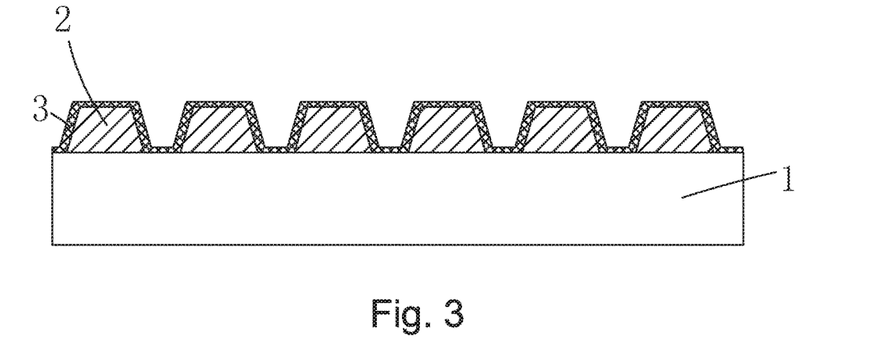
Figure 4:
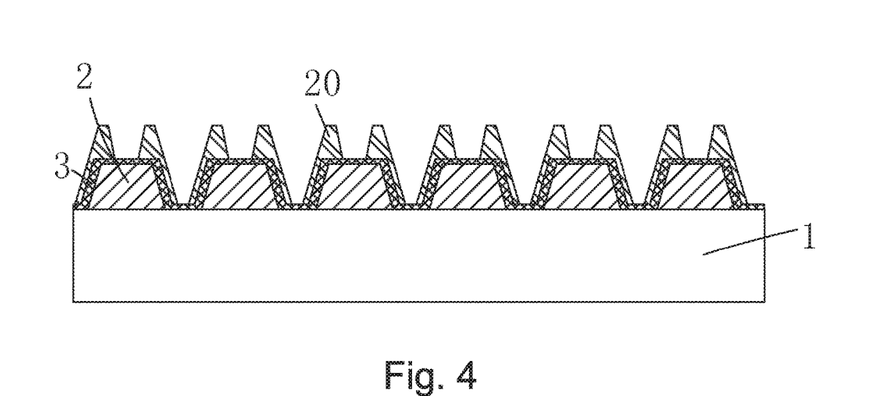

Step 13; please refer to FIGS. 3-4, a first insulating layer 3 is covered on the LED semi-conductor layer 2 and the original substrate 1. A patterned second photoresist layer 20 is formed on the first insulating layer 3.

Figure 5:
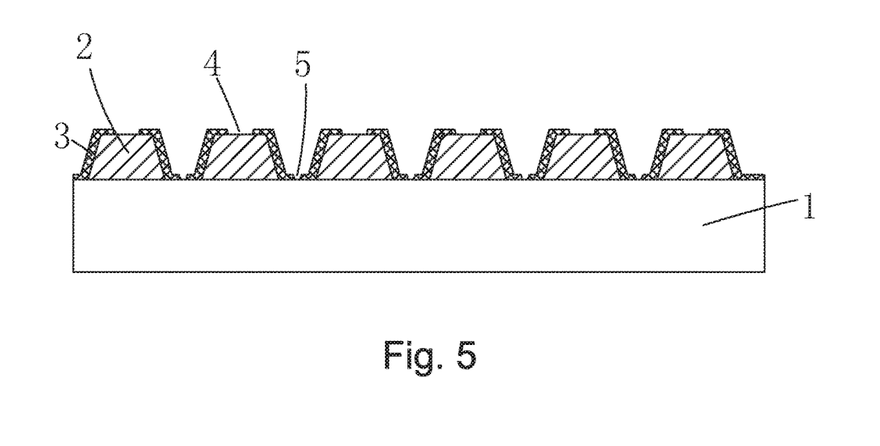

Step 14, please refer to FIG. 5, the first insulating layer 3 is etched with the second photoresist layer 20 as a shielding, to form a first via 4 and a second via 5, penetrating through the first insulating layer 3. The first via 4 and the second via 5 respectively reveal a portion of the LED semi-conductor layer 2 and a portion of the original substrate 1.

Figure 6:
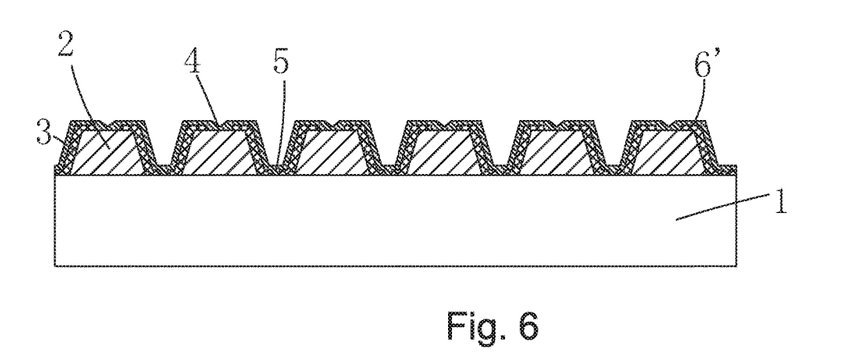
Figure 7:
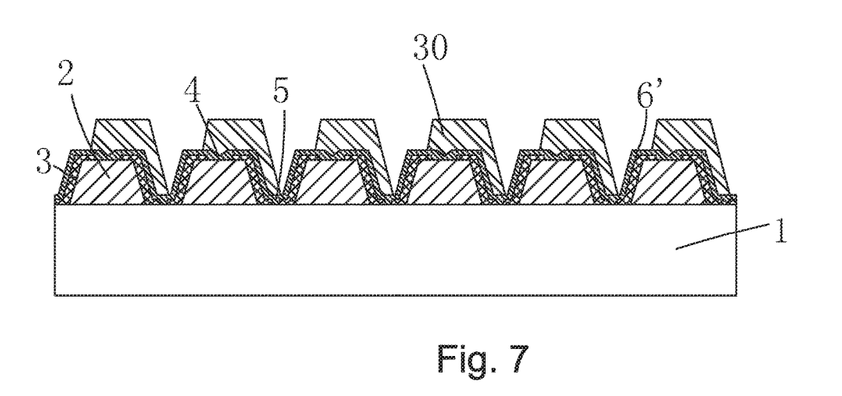

Step 15; please refer to FIGS. 6-7, a first metal thin film 6' is formed on the first insulating layer 3, the LED semi-conductor layer 2, and the original substrate 1. A patterned third photoresist layer 30 is formed on the first metal thin film 6'.

Figure 8:
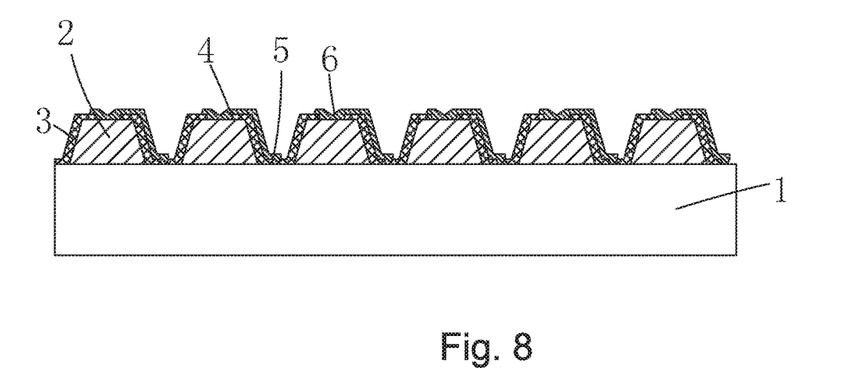

Step 16, please refer to FIG. 8, the first metal thin film 6' is etched with the third photoresist layer 30 as a shielding, to form a connection electrode 6. The connection electrode 6 respectively is contacted with the LED semi-conductor layer 2 and the original substrate 1 through the first via 4 and the second via 5.

Specifically, the original substrate 1 is a sapphire substrate ($Al2O3$), a silicon substrate (Si), a silicon carbide substrate (SiC), or a gallium nitride substrate (GaN), and the like. The LED semi-conductor layer 2 includes an N+ layer, a P+ layer and a multi-quantum well layer in contact with the N+ and P+ layers. The material of the connection electrode 6 may be a combination of one or more of metals such as nickel, molybdenum, aluminum, gold, platinum, and titanium. The material of the first insulating layer 3 is silicon oxide, silicon nitride, or alumina and the like.

Figure 9:
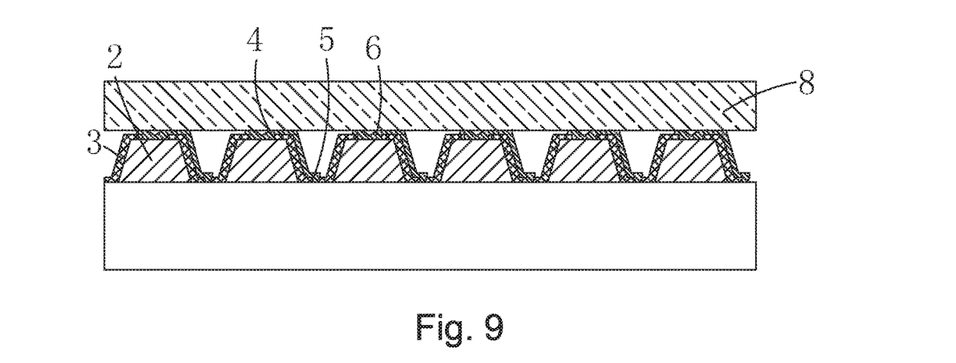
FIG. 9 is illustrative diagram of the step S2 of a method for manufacturing a micro light-emitting-diode display panel according to the present invention.

Step 2, please refer to FIG. 9, a transporting substrate 8 is provided. A surface of the transporting substrate 8 is bonded to the connection electrode 6. The original substrate 1 is peeled off, to transfer all of the LED semi-conductor layer 2, the first insulating layer 3, and the connection electrode 6 to the transporting substrate 8 and to expose the LED semi-conductor layer 2, the first insulating layer 3, and a portion of the connection electrode 6 contacted with the original substrate 1.

Specifically, the transporting substrate 8 in the step 2 is a hard substrate having an adhesive layer on its surface. With the adhesive layer on the surface of the hard substrate to adhere the connection electrode 6, to make the connection electrode 6 and the transporting substrate 8 be adhered to each other. The original substrate 1 is peeled off with a Laser lift-off (LLO) technology, to transfer the LED semi-conductor layer 2, the first insulating layer 3, and the connection electrode 6 to the transporting substrate 8. The LED semi-conductor layer 2, the first insulating layer 3, and the connection electrode 6 are upside down, in other words, portions of the LED semi-conductor layer 2, the first insulating layer 3, and the connection electrode 6, contacted with the original substrate 1 are away from the transporting substrate 8, to expose the portions of the LED semi-conductor layer 2 and the connection electrode 6 contacted with the original substrate 1.

Figure 10:
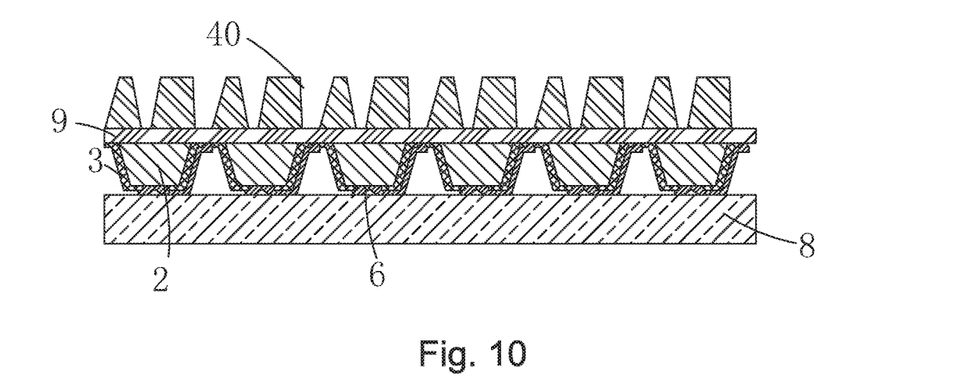
FIGS. 10-11 are illustrative diagrams of the step S3 of a method for manufacturing a micro light-emitting-diode display panel according to the present invention.
Figure 11:
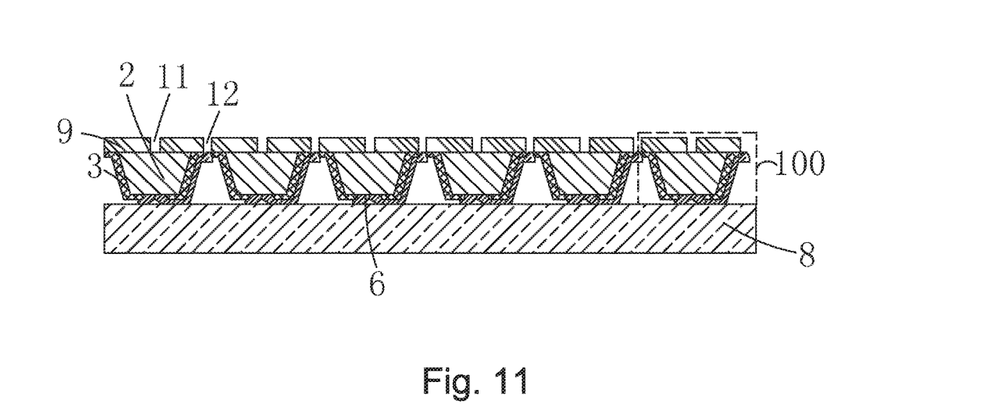

Step 3, please refer to FIGS. 10-11, a second insulating layer 9 is formed on the exposed LED semi-conductor layer 2, the first insulating layer 3, and the connection electrode 6. A first electrode via 11 and a second electrode via 12 are formed on the second insulating layer 9, respectively exposing a portion of the LED semi-conductor layer 2 and a portion of the connection electrode 6 by the first electrode via 11 and the second electrode via 12, to obtain a micro light-emitting-diode semi-finished product 100.

The second insulating layer 9 and the first insulating layer 3 together constitute an insulation-protective layer 14 surrounding the LED semi-conductor layer 2.

Specifically, the step 3 comprises:

Step 31, please refer to FIG. 10, a second insulating layer 9 is formed on the LED semi-conductor layer 2, the first insulating layer 3, and the connection electrode 6. A patterned fourth photoresist layer 40 is formed on the second insulating layer 9.

Step 32, please refer to FIG. 11, the second insulating layer 9 is etched with the fourth photoresist layer 40 as a shielding, to form a first electrode via 11 and a second electrode via 12, penetrating through the second insulating layer 9. The first electrode via 11 and the second electrode via 12 respectively reveal a portion of the LED semiconductor layer 2 and a portion of the connection electrode 6.

Specifically, the material of the second insulating layer 9 is silicon oxide, silicon nitride, or alumina and the like.

Figure 12:
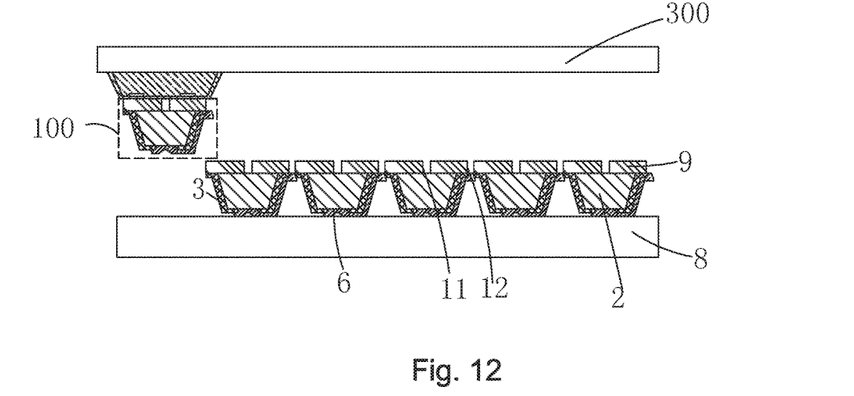
FIGS. 12 and 13 are illustrative diagrams of the step S4 and the step S5 of a method for manufacturing a micro light-emitting-diode display panel according to the present invention.
Figure 13:
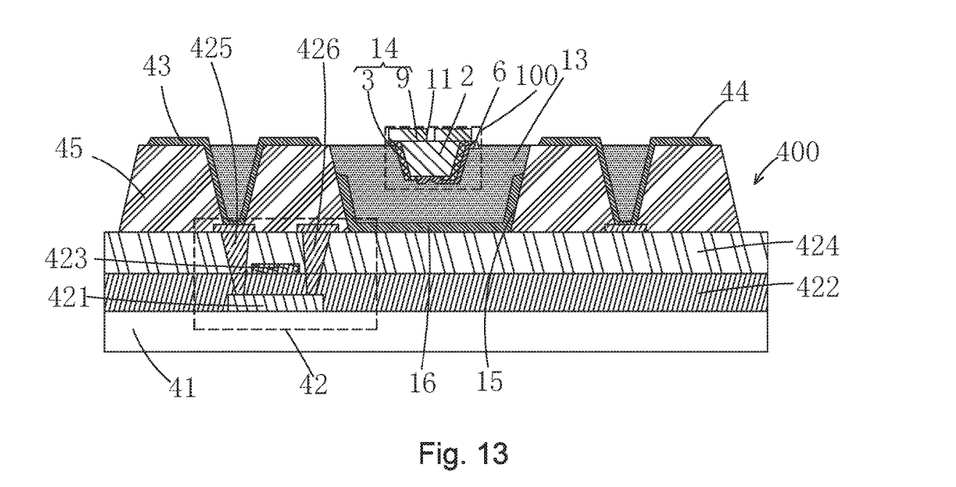

Step 4; please refer to FIGS. 12-13, a transfer head 300 and a receiving substrate 400 are provided. The receiving substrate 400 comprises: a base substrate 41, a pixel definition layer 45 disposed on the base substrate 41, a pixel groove 15 formed in the pixel definition layer 45, a resin adhesive layer 13 disposed in the pixel groove 15, and a first electrode point 43 and a second electrode point 44 on the pixel definition layer 45 respectively located on both sides of the pixel groove 15.

Specifically, the receiving substrate 400 provided in the step S4 further comprises: a TFT layer 42 disposed between the base substrate 41 and the pixel definition layer 45.

The TFT layer 42 comprises: an active layer 421 disposed on the base substrate 41, a gate insulating layer 422 covering the active layer 421 and the base substrate 41, a gate electrode 423 disposed on the gate insulating layer 422 above the active layer 421, an intermediate insulating layer 424 covering the gate electrode 423 and the gate insulating layer 422, and a source electrode 425 and a drain electrode 426 disposing on the intermediate insulating layer 424 and contacting with two ends of the active layer 421. The first electrode point 43 is further contacted with the source electrode 425. Specifically, the first electrode contact 43 is contacted with the source electrode 425 through a via extending through the pixel definition layer 45.

Step 5, please refer to FIGS. 12-13, the micro light-emitting-diode semi-finished product 100 on the transporting substrate 8 are transferred onto the pixel groove 15 of the receiving substrate 400 by the transfer head 300, to press and fix the micro light-emitting-diode semi-finished product 100 in the resin adhesive layer 13. The portion of the connection electrode 6 exposed by the second electrode via 12 and an upper surface of the LED semi-conductor layer 2 are both exposed to outside of the resin adhesive layer 13.

It is to be noted that the material of the resin adhesive layer 13 is a material having a large adhesive viscosity and can be cured by heat or ultraviolet (UV) light. Preferably, the resin adhesive layer 13 is made of poly Methyl methacrylate (PMMA). With pressing the micro light-emitting-diode semi-finished product 100 into the resin adhesive layer 13, the micro light-emitting-diode semi-finished product 100 is fixed, to prevent the positional deviation of the micro light-emitting-diode 200.

Step 6, please refer to FIGS. 14-17, a first electrode 71 and a second electrode 72 are formed on the micro light-emitting-diode semi-finished product 100, to form the micro light-emitting-diode 200. The first electrode 71 is contacted with the LED semi-conductor layer 2 and the first electrode point 43. The second electrode 72 is contacted with the connection electrode 6 and the second electrode point 44.

Figure 14:
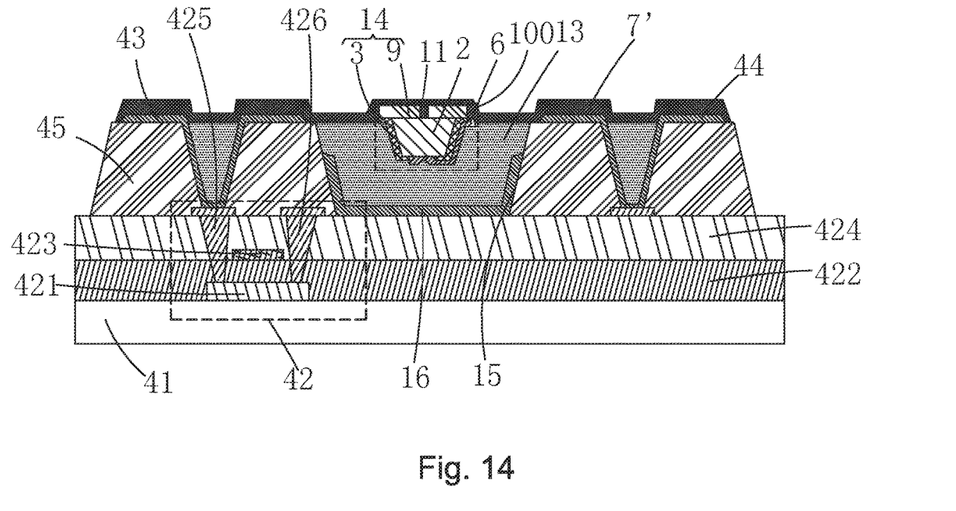
FIG. 14 is illustrative diagram of the step S61 of a method for manufacturing a micro light-emitting-diode display panel according to the present invention.

Specifically, the step 6 comprises:

Step 61, please refer to FIG. 14, a conductive thin film 7' is formed on the micro light-emitting-diode semi-finished product 100, the pixel definition layer 45, the first electrode point 43, the second electrode point 44, and the resin adhesive layer 13.

Figure 15:
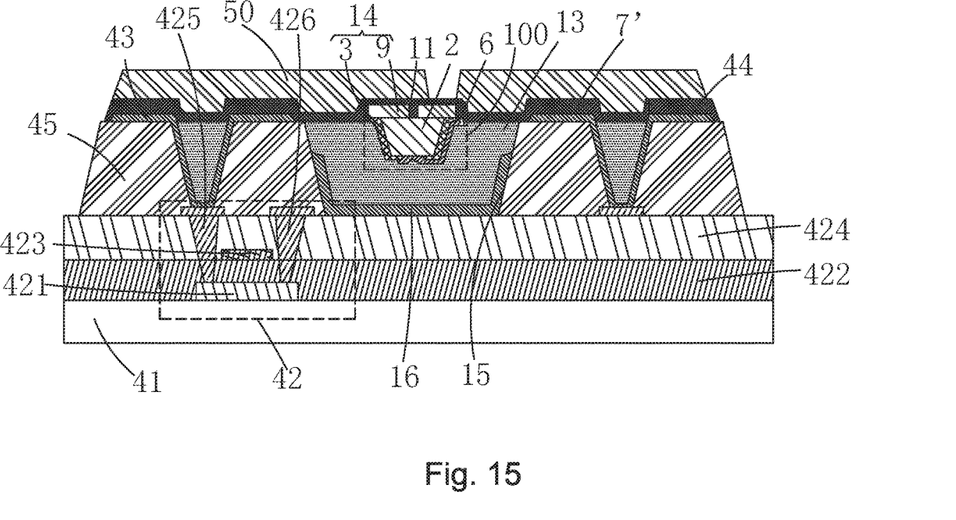
FIG. 15 is illustrative diagram of the step S62 of a method for manufacturing a micro light-emitting-diode display panel according to the present invention.

Step 62, please refer to FIG. 15, a patterned fifth photoresist layer 50 is formed on the conductive thin film 7'.

Figure 17:
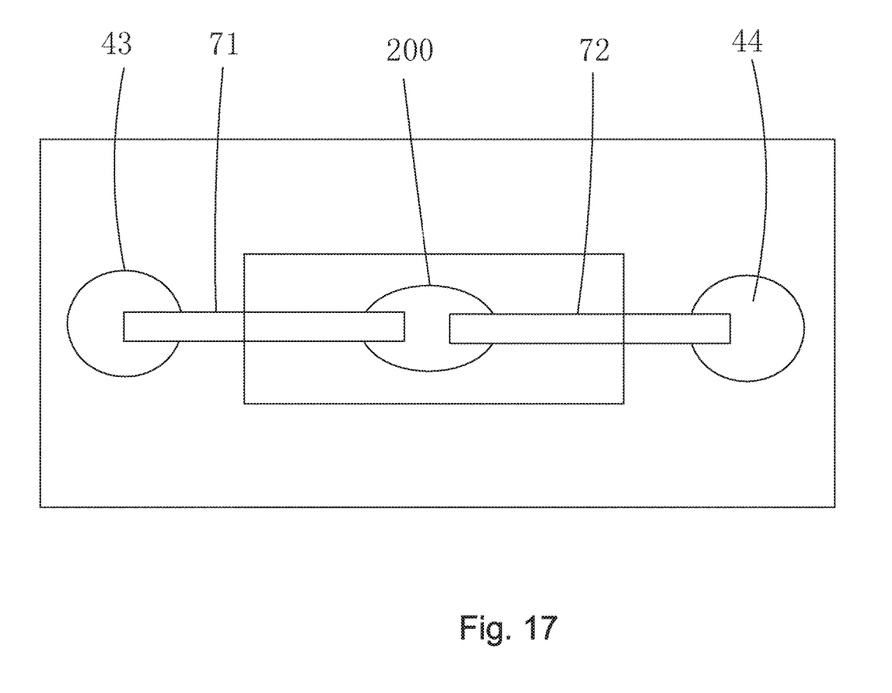
FIG. 17 is top-view illustration of the step S63 of a method for manufacturing a micro light-emitting-diode display panel according to the present invention.

Step 63; please refer to FIGS. 16-17, the conductive thin film 7' is etched with the fifth photoresist layer 50 as a shielding, to form a first electrode 71 and a second electrode 72.

Specifically, both the first electrode 71 and the second electrode 72 are transparent electrodes, such as ITO, IZO, or PEDOT: PSS.

It is to be noted that, in the method for manufacturing a micro light-emitting-diode display panel, the electrode of the bottom of the micro light-emitting-diode 200 to the top of the micro light-emitting-diode 200 is guided by the connection electrode 6, so that the two electrodes of the micro light-emitting-diode 200 are both at the top, not only the connection between the electrodes of the micro light-emitting-diode 200 and the electrode points can be facilitated, but also the difficulty of the electrode bonding of the micro light-emitting-diode 200 can be reduced and the reliability of the electrode bonding of the micro light-emitting-diode 200 can be improved.

As mentioned above, the present invention provides a micro light-emitting-diode display panel which presses and fixes the micro light-emitting-diodes into a resin adhesive layer by filling the resin adhesive layer in the pixel groove. Meanwhile, the electrode at the bottom of the micro light-emitting-diode is guided to the top of the micro light-emitting-diode by the connection electrode, making the two electrodes of the micro light-emitting-diode are at the top, to facilitate the connection between the electrodes of the micro light-emitting-diode and the electrode points, which can reduce the difficulty of the electrode bonding of the micro light-emitting-diode, and improve the reliability of the electrode bonding of the micro light-emitting-diode. The invention also provides a method for manufacturing a micro light-emitting-diode display panel, which can reduce the difficulty of the electrode bonding of the micro light-emitting-diode, and improve the reliability of the electrode bonding of the micro light-emitting-diode.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. A method for manufacturing a micro light-emitting-diode display panel, comprising:

step 1, providing an original substrate, orderly forming an LED semi-conductor layer disposed on the original substrate, a first insulating layer covering the LED semi-conductor layer and the original substrate, and a connection electrode disposed on the first insulating layer and contacted with the LED semi-conductor layer and the original substrate;

step 2, providing a transporting substrate, bonding a surface of the transporting substrate to the connection electrode, peeling off the original substrate, to transfer all of the LED semi-conductor layer, the first insulating layer, and the connection electrode to the transporting substrate and to expose the LED semi-conductor layer, the first insulating layer, and a portion of the connection electrode pointed with the original substrate;

step 3, forming a second insulating layer on the exposed LED semi-conductor layer, the first insulating layer, and the connection electrode, forming a first electrode via and a second electrode via on the second insulating layer, respectively exposing a portion of the LED semi-conductor layer and a portion of the connection electrode by the first electrode via and the second electrode via, to obtain a micro light-emitting-diode semi-finished product;

step 4, providing a transfer head and a receiving substrate, the receiving substrate comprising: a base substrate, a pixel definition layer disposed on the base substrate, a pixel groove formed in the pixel definition layer, a resin adhesive layer disposed in the pixel groove, and a first electrode point and a second electrode point on the pixel definition layer respectively located on both sides of the pixel groove;

step 5, transferring the micro light-emitting-diode semi-finished product on the transporting substrate onto the pixel groove of the receiving substrate by the transfer head, to press and fix the micro light-emitting-diode semi-finished product in the resin adhesive layer, and the portion of the connection electrode exposed by the second electrode via and an upper surface of the LED semi-conductor layer are both exposed to outside of the resin adhesive layer;

step 6, forming a first electrode and a second electrode on the micro light-emitting-diode semi-finished product to form the micro light-emitting-diode, the first electrode contacting with the LED semi-conductor layer and the first electrode point, the second electrode contacting with the connection electrode and the second electrode point.

2. The method for manufacturing a micro light-emitting-diode display panel according to claim 1, wherein the step S1 specifically comprises:

step 11, providing an original substrate, forming an LED semi-conductor thin film on the original substrate, forming a patterned first photoresist layer on the LED semi-conductor thin film;

step 12, etching the LED semi-conductor thin film with the first photoresist layer as a shielding, to form a LED semi-conductor layers;

step 13, covering a first insulating layer on the LED semi-conductor layer and the original substrate, forming a patterned second photoresist layer on the first insulating layer;

step 14, etching the first insulating layer with the second photoresist layer as a shielding, to form a first via and a second via, penetrating through the first insulating layer, the first via and the second via respectively reveals a portion of the LED semi-conductor layer and a portion of the original substrate;

step 15, forming a first metal thin film on the first insulating layer, the LED semi-conductor layer, and the original substrate, forming a patterned third photoresist layer on the first metal thin film;

step 16, etching the first metal thin film with the third photoresist layer as a shielding, to form a connection electrode, the connection electrode respectively contacting with the LED semi-conductor layer and the original substrate through the first via and the second via.

3. The method for manufacturing a micro light-emitting-diode display panel according to claim 1, wherein the transporting substrate in the step 2 is a hard substrate having an adhesive layer on its surface, and in the step 2, the original substrate is peeled off by a laser lift-off process.

4. The method for manufacturing a micro light-emitting-diode display panel according to claim 1, wherein the step 3 specifically comprises:

step 31, forming a second insulating layer on the LED semi-conductor layer, the first insulating layer, and the connection electrode, forming a patterned fourth photoresist layer on the second insulating layer;

step 32, etching the second insulating layer with the fourth photoresist layer as a shielding, to form a first electrode via and a second electrode via, penetrating through the second insulating layer, the first electrode via and the second electrode via respectively reveals a portion of the LED semi-conductor layer and a portion of the connection electrode.

5. The method for manufacturing a micro light-emitting-diode display panel according to claim 1, wherein the receiving substrate provided in the step S4 further comprises: a TFT layer disposed between the base substrate and the pixel definition layer;

the TFT layer comprises: an active layer disposed on the base substrate, a gate insulating layer covering the active layer and the base substrate, a gate electrode disposed on the gate insulating layer above the active layer, an intermediate insulating layer covering the gate electrode and the gate insulating layer, and a source electrode and a drain electrode disposing on the intermediate insulating layer and contacting with two ends of the active layer; the first electrode point further being contacted with the source electrode.

6. The method for manufacturing a micro light-emitting-diode display panel according to claim 1, wherein the step 6 specifically comprises:

step 61, forming a conductive thin film on the micro light-emitting-diode semi-finished product, the pixel definition layer, the first electrode point, the second electrode point, and the resin adhesive layer;

step 62, forming a patterned fifth photoresist layer on the conductive thin film;

step 63, etching the conductive thin film with the fifth photoresist layer as a shielding, to form a first electrode and a second electrode.

7. The method for manufacturing a micro light-emitting-diode display panel according to claim 1, wherein the resin adhesive layer is made of PMMA.

8. A method for manufacturing a micro light-emitting-diode display panel, comprising:

step 1, providing an original substrate, orderly forming an LED semi-conductor layer disposed on the original substrate, a first insulating layer covering the LED semi-conductor layer and the original substrate, and a connection electrode disposed on the first insulating layer and contacted with the LED semi-conductor layer and the original substrate;

step 2, providing a transporting substrate, bonding a surface of the transporting substrate to the connection electrode, peeling off the original substrate, to transfer all of the LED semi-conductor layer, the first insulating layer, and the connection electrode to the transporting substrate and to expose the LED semi-conductor layer, the first insulating layer, and a portion of the connection electrode contacted with the original substrate;

step 3, forming a second insulating layer on the exposed LED semi-conductor layer, the first insulating layer, and the connection electrode, forming a first electrode via and a second electrode via on the second insulating layer, respectively exposing a portion of the LED semi-conductor layer and a portion of the connection electrode by the first electrode via and the second electrode via, to obtain a micro light-emitting-diode semi-finished product;

step 4, providing a transfer head and a receiving substrate, the receiving substrate comprising: a base substrate, a pixel definition layer disposed on the base substrate, a pixel groove formed in the pixel definition layer, a resin adhesive layer disposed in the pixel groove, and a first electrode point and a second electrode point on the pixel definition layer respectively located on both sides of the pixel groove;

step 5, transferring the micro light-emitting-diode semi-finished product on the transporting substrate onto the pixel groove of the receiving substrate by the transfer head, to press and fix the micro light-emitting-diode semi-finished product in the resin adhesive layer, and the portion of the connection electrode exposed by the second electrode via and an upper surface of the LED semi-conductor layer are both exposed to outside of the resin adhesive layer;

step 6, forming a first electrode and a second electrode on the micro light-emitting-diode semi-finished product to form the micro light-emitting-diode, the first electrode contacting with the LED semi-conductor layer and the first electrode point, the second electrode contacting with the connection electrode and the second electrode point wherein the step S1 specifically comprises:

step 11, providing an original substrate, forming an LED semi-conductor thin film on the original substrate, forming a patterned first photoresist layer on the LED semi-conductor thin film;

step 12, etching the LED semi-conductor thin film with the first photoresist layer as a shielding, to form a LED semi-conductor layers;

step 13, covering a first insulating layer on the LED semi-conductor layer and the original substrate, forming a patterned second photoresist layer on the first insulating layer;

step 14, etching the first insulating layer with the second photoresist layer as a shielding, to form a first via and a second via, penetrating through the first insulating layer, the first via and the second via respectively reveals a portion of the LED semi-conductor layer and a portion of the original substrate;

step 15, forming a first metal thin film on the first insulating layer, the LED semi-conductor layer, and the original substrate, forming a patterned third photoresist layer on the first metal thin film;

step 16, etching the first metal thin film with the third photoresist layer as a shielding, to form a connection electrode, the connection electrode respectively contacting with the LED semi-conductor layer and the original substrate through the first via and the second via;

wherein the transporting substrate in the step 2 is a hard substrate having an adhesive layer on its surface, and in the step 2, the original substrate is peeled off by a laser lift-off process.

9. The method for manufacturing a micro light-emitting-diode display panel according to claim 8, wherein the step 3 specifically comprises:

step 31, forming a second insulating layer on the LED semi-conductor layer, the first insulating layer, and the connection electrode, forming a patterned fourth photoresist layer on the second insulating layer;

step 32, etching the second insulating layer with the fourth photoresist layer as a shielding, to form a first electrode via and a second electrode via, penetrating through the second insulating layer, the first electrode via and the second electrode via respectively reveals a portion of the LED semi-conductor layer and a portion of the connection electrode.

10. The method for manufacturing a micro light-emitting-diode display panel according to claim 8, wherein the receiving substrate provided in the step S4 further comprises: a TFT layer disposed between the base substrate and the pixel definition layer;

the TFT layer comprises: an active layer disposed on the base substrate, a gate insulating layer covering the active layer and the base substrate, a gate electrode disposed on the gate insulating layer above the active layer, an intermediate insulating layer covering the gate electrode and the gate insulating layer, and a source electrode and a drain electrode disposing on the intermediate insulating layer and contacting with two ends of the active layer; the first electrode point further being contacted with the source electrode.

11. The method for manufacturing a micro light-emitting-diode display panel according to claim 8, wherein the step 6 specifically comprises:

step 61, forming a conductive thin film on the micro light-emitting-diode semi-finished product, the pixel definition layer, the first electrode point, the second electrode point, and the resin adhesive layer;

step 62, forming a patterned fifth photoresist layer on the conductive thin film;

step 63, etching the conductive thin film with the fifth photoresist layer as a shielding, to form a first electrode and a second electrode.

12. The method for manufacturing a micro light-emitting-diode display panel according to claim 8, wherein the resin adhesive layer is made of PMMA.

* * * * *